United States Patent
Doussiere (10) Patent No.: US 10,193,308 B2
(45) Date of Patent: Jan. 29, 2019

(54) SEMICONDUCTOR LASER WITH TENSILE STRAINED INALAS ELECTRON BLOCKER FOR 1310 NANOMETER HIGH TEMPERATURE OPERATION

(71) Applicant: Intel Corporation, Santa Clara, CA (US)

(72) Inventor: Pierre Doussiere, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/627,291

(22) Filed: Jun. 19, 2017

(65) Prior Publication Data

US 2018/0366914 A1    Dec. 20, 2018

(51) Int. Cl.
*H01S 5/34*    (2006.01)
*H01S 5/343*    (2006.01)
*H01S 5/20*    (2006.01)

(52) U.S. Cl.
CPC ........ *H01S 5/34313* (2013.01); *H01S 5/2054* (2013.01); *H01S 5/3403* (2013.01); *H01S 5/3434* (2013.01); *H01S 5/34306* (2013.01); *H01S 5/34366* (2013.01)

(58) Field of Classification Search
CPC .. H01S 5/2009; H01S 5/3406; H01S 5/34313; H01S 5/34366
See application file for complete search history.

(56) References Cited

U.S. PATENT DOCUMENTS

| 2004/0131098 A1* | 7/2004 | Garbuzov | .............. | B82Y 20/00 |
| | | | | 372/45.01 |
| 2005/0185909 A1* | 8/2005 | Bour | ...................... | B82Y 20/00 |
| | | | | 385/131 |

OTHER PUBLICATIONS

Ohtoshi et al, "Suppression of leakage current in InGaAsP/InP laser Buried Heterostructure Lasers by InAlAs Strained Current-Blocking Layers", Electronics Letters, Jan. 3, 1991, pp. 12-13, vol. 27, No. 1.

* cited by examiner

*Primary Examiner* — Michael Carter
(74) *Attorney, Agent, or Firm* — Schwabe, Williamson & Wyatt, P.C.

(57) ABSTRACT

Embodiments may relate to a multiple quantum well (MQW) laser for operating at high temperatures, comprising at least one quantum well made of compressively strained InGaAlAs layers that are alternatively stacked with tensile strained InGaAlAs layers, the at least one quantum well surrounded on one side by a n-doped InP cladding and on the other by a p-doped InP cladding so as to form a double hetero-junction. A confinement layer of lattice-matched InAlAs may be provided between the quantum well and the p-doped cladding, having a first surface facing or adjacent to the quantum well and a second surface facing or adjacent to the p-doped cladding. An additional electron containment layer of tensile strained InAlAs may be provided facing or adjacent to one surface of the confinement layer, having a thickness smaller than that of the confinement layer. Other embodiments may be described and/or claimed.

24 Claims, 5 Drawing Sheets

FIG. 1B AEB type design

SEMICONDUCTOR LASER WITH TENSILE STRAINED INALAS ELECTRON BLOCKER FOR 1310 NANOMETER HIGH TEMPERATURE OPERATION

TECHNICAL FIELD

Embodiments of the present disclosure generally relate to the field of increasing efficiency in multiple quantum well (MQW) lasers.

BACKGROUND

Internally fabricated semiconductor lasers may be used as components in optical transceivers for digital communications products. It may be useful for the laser to operate within as small an electrical power budget as possible, while providing sufficient optical power to span the communication link with low bit-error rate. The efficiency of the laser may therefore be important for the competitiveness of the overall transmitter.

Laser efficiency is in part determined by an effective injection of electrical carriers in the active layer where the Quantum Wells sit that provide light amplification. When the laser is used in high temperature conditions, the injection of electrical carriers into the Quantum Wells is made increasingly difficult as the n-type carriers (electrons) tend to overflow the confinement barrier formed by the p-doped cladding, and then diffuse into the p-doped cladding where they recombine, in a non-radiative way, with majority incoming p-type carriers, instead of being involved in radiative recombination within the Quantum Wells that generate photons.

In the Indium-Gallium-Aluminum-Arsenide/Indium-Phosphide (InGaAlAs/InP) semiconductor material system, which is generally used to make 1310 nanometer (nm) emitting lasers when high temperature is a constraint, the electrical confinement of n-carriers may be improved by inserting a thin layer of lattice-matched Indium Aluminum Arsenide (InAlAs) between the Multiple-Quantum-Wells (MQWs) and the InP p-type cladding. This is because the Band-Gap energy of InAlAs is larger than the band-gap energy of InP, and therefore provides a higher Conduction Band Energy Discontinuity (Delta Ec) that prevents the n-type carriers from migrating to the p-doped InP cladding.

It is noted that the term "lattice matched" refers to matching of lattice structures between two different semiconductor materials. This allows a region of band gap change to be formed in a material without introducing a change in crystal structure, and is what allows the construction of advanced light-emitting diodes and diode lasers. Lattice matched structures have the same lattice constant, or lattice parameter, which refers to the physical dimension of unit cells in a crystal lattice. Thus, the lattice constant is the distance between atoms in cubic-cell crystals, and may be used as a measure of structural compatibility of various crystals. For example, gallium arsenide (GaAs), aluminum gallium arsenide (AlGaAs), and aluminum arsenide (AlAs) have almost equal lattice constants, making it possible to grow almost arbitrarily thick layers of one on the other one. Though sometimes effective, the lattice matched InAlAs layer does not always prevent n-carriers from spilling into the p-doped InP cladding, particularly when the temperature is higher than 80° C. and the wavelength emission is lower than 1270 nm.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the description to follow, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "link" or "communications link" as used herein may refer to any transmission medium, either tangible or intangible, which is used to communicate data or a data stream. Additionally, the term "link" may be synonymous with and/or equivalent to "communications channel," "data communications channel," "transmission channel," "data transmission channel,"

"access channel," "data access channel," "channel," "data link," "radio link," "carrier," "radiofrequency carrier," and/or any other like term denoting a pathway or medium through which data is communicated.

As used hereinafter, including the claims, the term "facing" as used herein may refer to a first object, element or structure being provided near, or on one side of a second object, element or structure, with or without the two objects touching each other.

As used hereinafter, including the claims, the term "circuitry", including "communications circuitry" or "supporting circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality and/or any combination of software, firmware or hardware. In some embodiments, the circuitry may implement, or functions associated with the circuitry may be implemented by, one or more software or firmware modules.

In embodiments, n-carrier confinement in MQWs may be improved by using tensile strained InAlAs—instead of lattice matched InAlAs—which may therefore improve the efficiency of lasers emitting at around 1310 nm and operating at high temperature.

In embodiments, the barrier effect to electron diffusion of InAlAs may be further improved by using an additional layer of biaxial tensile strained InAlAs to take advantage of the greater band-gap of tensile strained InAlAs as compared to lattice matched InAlAs. In embodiments, this, in turn, may result in a larger conduction band energy discontinuity between the MQWs and the p-doped cladding. In embodiments, significant improvements in both optical power and wall plug efficiencies have been observed at high temperatures using various embodiments for 1310 nm emitting laser sources.

It is noted that one way to improve the electron blocking effect of InAlAs is to increase the p-type doping level of the InAlAs confinement layer. This moves the Fermi levels closer to the Valence-Band and therefore further displaces the Band-Gap-Discontinuity (Delta Ec) in the conduction band. However, increasing doping is not as effective as using tensile strained InAlAs to enlarge the Conduction-Band-Discontinuity (Delta Ec), as done in various embodiments, inasmuch as one may only increase the Delta Ec by, at best, 50 milli-electronvolts (meV) using this increased doping technique. On the other hand, a tensile strain of −0.5% can displace the Delta Ec by about 100 meV. In addition, it is noted that increasing the p-type doping of the InAlAs confinement layer also increases optical losses. This is because Zinc, the p-type dopant generally used in the InGaAlAs/InP semiconductor material system used to make 1310 nm emitting lasers, tends to diffuse into the Quantum-Wells, which is detrimental to both the quality and the reliability of the Quantum-Wells.

However, combining the two approaches may offer significant benefit. Thus, using tensile strained InAlAs in various embodiments can also benefit by a higher p-doping. The higher doping also increases the Conduction-Band-Discontinuity (Delta Ec), with the advantage that, in embodiments, because the Tensile strained InAlAs layer may be very thin it will not significantly create problems of Zinc (Zn) diffusion or optical losses as is the case for simply increasing the doping of a lattice matched InAlAs confinement layer.

Figure 1A:
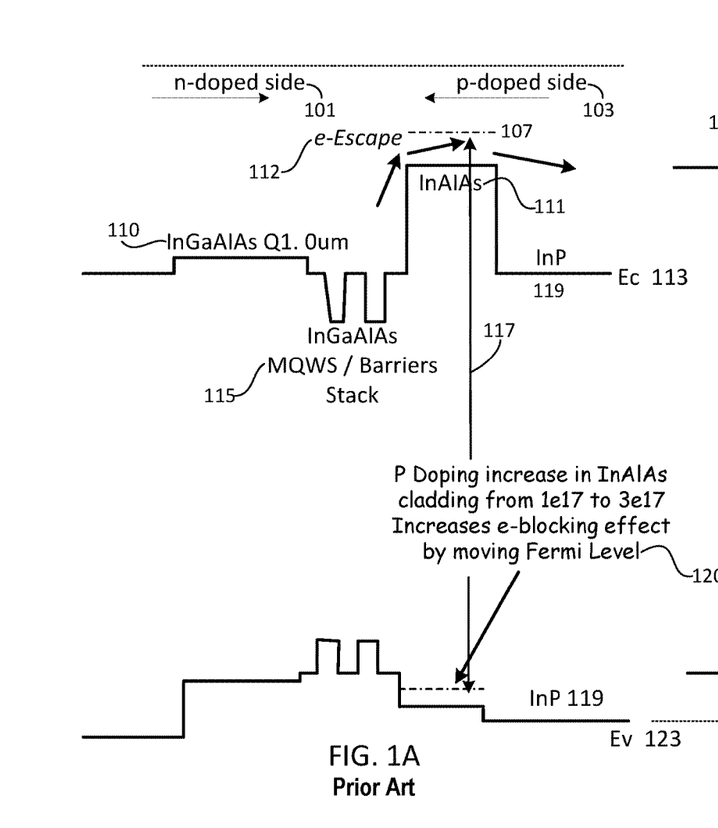
FIGS. 1A and 1B depict a side by side comparison of a conventional InGaAlAs/InAlAs/InP MQW laser, in FIG. 1A, and the same laser provided with an added layer of tensile strain InAlAs to a barrier between the MQWs and p-doped InP cladding, in FIG. 1B, in accordance with embodiments herein.
Figure 1B:
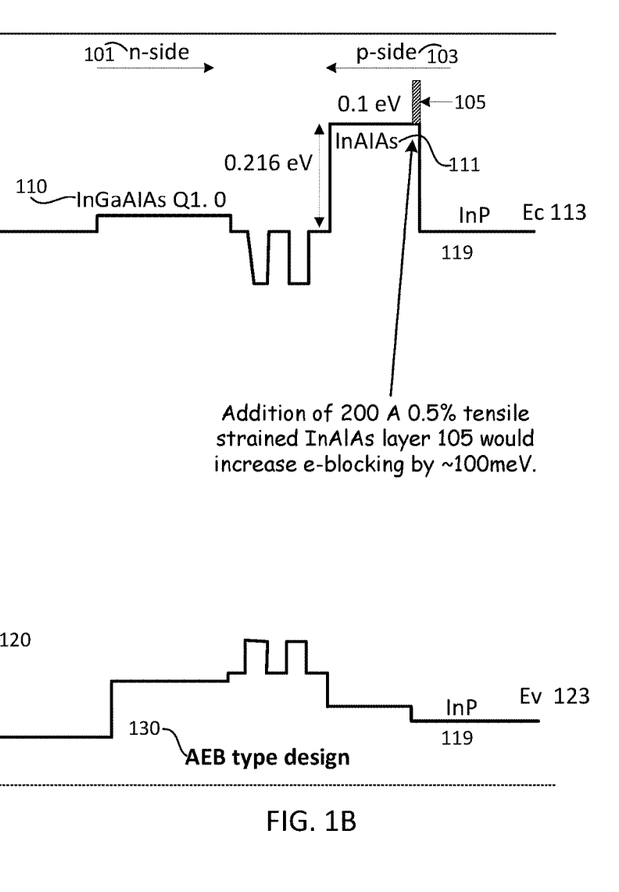

With reference to FIGS. 1A and 1B, details of MQW InGaAlAs/InP lasers with an additional tensile strained InAlAs blocking layer according to various embodiments, are next described.

MQW InGaAlAs/InP lasers emitting at around 1310 nm (or slightly above or below that, such as in the range of approximately 1050 nm-1400 nm), and aimed at high temperature operation, generally consist of at least three or more quantum wells made of compressively strained InGaAlAs that are alternatively stacked with higher band-gap (around 1.24 eV) barriers that are generally made of tensile strained InGaAlAs.

FIGS. 1A and 1B depict such a MQW laser in two forms. FIG. 1A depicts a conventional MQW laser. FIG. 1B illustrates the same MQW laser, with an additional InAlAs tensile strained thin containment layer (or electron blocking layer) provided between the InAlAs confinement layer and the p-doped InP cladding, according to various embodiments. FIGS. 1A and 1B actually show the Conduction-band Energy Level Ec, and Valence-band Energy Level Ev, respectively, and thus their difference, Delta Ec, as they change moving through the structure of the MQW laser. Thus, in FIGS. 1A and 1B, reading from left to right, both the structure and the related energy bands of that structure, of each example MQW laser, are depicted. In embodiments, the depicted regions of an actual MQW laser of this type may be stacked vertically, with the left of each figure representing the bottom, and the right of each figure representing the top, of a MQW laser structure. In embodiments, the light is emitted out of the active region, which is the MQWs/Barriers Stack 115 in the middle of each figure.

With reference to FIG. 1A, the left side of the figure shows the n-doped side 101, and the right side of FIG. 1A shows the p-doped side 103. Also shown are the energy levels of the conduction band, Ec 113 and the valence band, Ev 123, as noted above.

The active region of the MQW laser may be 0.1 um thick, made of InGaAlAs 110. It may comprise a stack of quantum wells and barriers, MQWS/Barriers Stack 115, which is generally non-doped. It is noted that there is no standard number of quantum wells but it is generally above two. However, in embodiments, there may be one or more Quantum Wells. FIGS. 1A and 1B show examples where two QWs are used, but, in embodiments, various numbers of QWs are possible.

Thus, in embodiments, the active region may generally consist of at least three or more QWs made of compressively strained InGaAlAs that are alternatively stacked with higher band-gap (around 1.24 eV) barriers that are generally made of tensile strained InGaAlAs. It may be surrounded on one side by a n-doped cladding of InP (not shown) and on the other side by a p-doped cladding of InP 119 so as to form a double hetero-junction that effectively spatially confines both electrons and holes in the quantum wells where they can recombine in a radiative way with each other.

However, because the Conduction-Energy-Band-Discontinuity between the tensile strained InGaAlAs barriers 116 and the p-doped InP cladding 119 is not very large (around 40 meV), n-carriers injected in the double heterojunction can easily diffuse into the p-doped InP cladding 119 and thereby generate a non-radiative leakage current than degrades laser efficiency (inasmuch as these injected n-carriers never combine in the active region to generate photons). This problem is even more pronounced at 1270 nm as the electron confinement is reduced when one goes from a 1310 nm emitted wavelength laser to a 1270 nm emitted wavelength.

To remedy this problem, a thin layer of lattice matched InAlAs 111 may be inserted between the MQWs/barriers stack 115 and the p-doped InP cladding 119 to prevent the n-carriers from diffusing into the p-doped cladding 119. The band gap (1.496 eV) of InAlAs is significantly higher than that of InP (1.34 eV) and therefore this lattice matched confinement layer increases the energy conduction band discontinuity (to about 220 meV) and thereby prevents the n-carriers from diffusing into p-doped InP cladding 119. However, this confinement layer does not totally stop such n-carrier diffusion, as shown in FIG. 1A at 110, and thus some electrons (the n-carriers) do escape even over the increased band gap into the p-doped InP cladding 119, as shown by the arrows in FIG. 1A going up from the active region 115 and over the thin layer of InAlAs 111. This electron escape effect is even more pronounced at emission wavelengths below 1310 nm.

Additionally, lattice-matched thin layer of InAlAs 111 may also have its p-doping increased to increase its electron blocking effect, as is illustrated in FIG. 1A at 120, and thus, by raising the Ec of such greater p-doped InAlAs layer 111, to dotted line 107, the e-Escape phenomenon shown at 112 in FIG. 1A may be curtailed.

However, it is found that even adding a lattice matched InAlAs layer 111, and even increasing its p-doping, does not offer a high enough conduction-band discontinuity to guarantee a negligible leakage of n-carriers when the temperature gets higher than 80° C. and the wavelength shorter than 1310 nm, such as is the case in the range 1050 nm to 1310 nm. Thus, as shown in FIG. 1B, in embodiments, an additional layer of −0.5% tensile strained InAlAs 105 may be inserted on top of (i.e., to the right of in FIG. 1B) the lattice matched InAlAs layer 111, inasmuch as, as shown in FIG. 1B, it offers an even higher Conduction-Band-Discontinuity (Delta Ec). This is because the band-gap-energy of −0.5% tensile strained InAlAs is about 1.7 eV. As noted, adding a tensile strained electron blocker layer, according to various embodiments, has even more effect at 1270 nm and lower wavelengths, as the electron confinement of lattice-matched InAlAs 111 is even further reduced as the emitted wavelength goes from 1310 nm to 1270 nm, or lower.

In fact, in embodiments, the tensile strained InAlAs additional layer 105 can also be placed at the bottom of (i.e., to the left of, in FIG. 1B) the InAlAs lattice matched layer 111 for the same effect. In fact, the tensile strained InAlAs additional layer 105 may be placed anywhere within the InAlAs lattice matched layer 111 as well. The increase of conduction-band discontinuity (Delta Ec) is difficult to estimate as InAlAs material is not fully understood, but it is understood to be approximately 100 meV. In embodiments, the additional layer of tensile strained InAlAs must be thick enough to avoid the n-carriers from tunneling through it, yet thin enough so that it stays below the critical thickness $t_c$ that causes relaxation and formation of dislocations in the lattice. In embodiments, such a minimum thickness may be 80 Angstroms. Thus, in embodiments, a thickness between 80 A and 200 A for the −0.5% tensile strain additional layer may be optimal. It is also noted that in theory a higher strain could provide even more electrical confinement, but then at some point the critical thickness becomes too thin to prevent tunneling and it is generally considered difficult (though not impossible) to grow tensile strained material with level of strain higher than −0.6% as the material starts to form islands during epitaxial growth instead for growing in a uniform layer. Thus, in embodiments, a higher level of strain may be beneficial, as long as the confinement layer is thick enough to prevent tunneling of the n-carrier but does not form a notch in the Valence-Energy band Ev 123 that would prevent efficient injection of holes into the MQWs.

It is noted that depending on the wavelength, even a −0.1% tensile strain in an additional confinement layer begins to provide measurable benefit. On the other hand, strains lower than −0.1% are difficult to control and measure. Thus, in embodiments, a minimum of −0.1% tensile strain may be used.

It is also noted that there is a relation between strain and maximum thickness, as the critical thickness depends on the strain and is determined by the Matthews-Blakeslee limit. Thus, in embodiments, for a given chosen strain, the thickness should be less than the critical thickness tc, as determined by the Matthews-Blakeslee equations, which will be a function of the composition of the barrier layer, the composition of the substrate, and the lattice mismatch between the two layers, and the natural (relaxed) lattice constant of the epilayer. It should also be greater than be thick enough to avoid the n-carriers from tunneling through it, as noted above.

In embodiments, if a lower tensile strain is used in an InAlAs additional confinement layer, then the thickness of the additional confinement layer may be increased, as tc is larger for lower strain. In embodiments, for example, if a −0.1% tensile strain is used in an additional confinement layer, then the Matthews-Blakeslee limit gives a tc of approximately 1500 Angstroms. Further, when both the substrate and the epilayer ae InAlAs, just the substrate is lattice matched InAlAs and the epilayer is our described tensile InAlAs, the Matthews-Blakeslee limit reduce to a simple calculation of tc.

In embodiments, it is not necessary to use an InAlAs lattice matched layer 111 at all. In such case the InAlAs tensile strained layer may sit on top of, or be positioned above, the MQW last barrier layer, such as the top (or rightmost in FIG. 1) tensile strained InGaAlAs barrier 116 and p-doped InP cladding 119. It is noted that, in embodiments, the tensile strained layer may be positioned anywhere on the p-side of the MQWs, and there may be one or more neutral layers between the tensile strained layer and either or both of the last MQW barrier layer, such as the top (or rightmost in FIG. 1) tensile strained InGaAlAs barrier 116, the and p-doped InP cladding layer 119.

In all respects other than the additional tensile strained InAlAs containment layer 105, FIG. 1B is identical to FIG. 1A, and thus FIG. 1B will not be explained further.

It is noted that although the enhanced electron blocking power of tensile strained InAlAs—compared to that of lattice matched InAlAs—has been recognized to reduce current leakage in lateral blocking pnp layers of a Buried-Hetero-structure (BH) laser, its use for containing n-carriers in the MQWs of an active material is hitherto unknown.

In embodiments, a considerable increase of conversion efficiency at 80° C. was observed when adding an extra 200 Angstrom layer of −0.5% tensile strained InAlAs. Peak wall plug efficiency improved by 43%, and Optical power increased by 60% at fixed current, as shown in FIGS. 2 through 5, when compared with a similar laser that does not include that layer. At the same time no penalty on either the series resistance or the diode characteristic voltage was observed, which means that no significant notch or discontinuity is formed in the Valence-Band as a result of the insertion of tensile strain InAlAs according to various embodiments.

Figure 2:
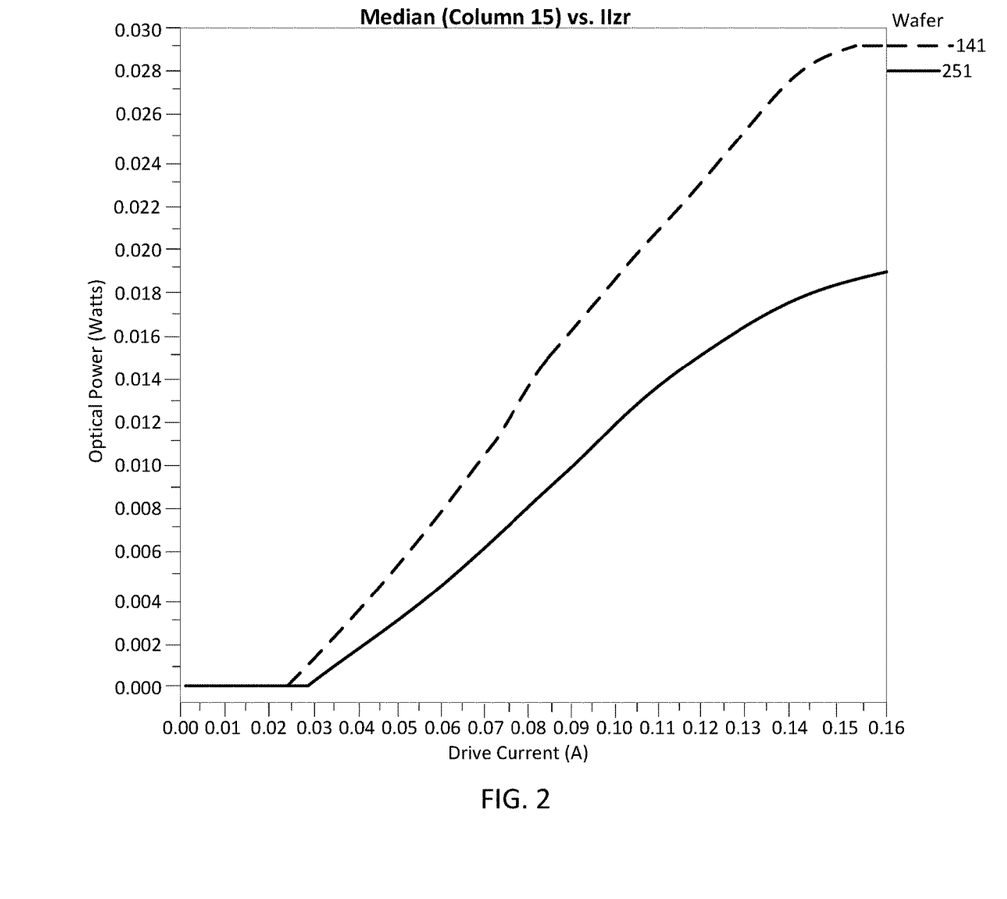
FIG. 2 depicts a plot of optical power as a function of drive current for each of an example conventional MQW laser and an example MQW laser as enhanced with a layer of tensile strain InAlAs in accordance with embodiments herein.

With reference to FIG. 2, a comparison of two lasers, such as are depicted schematically in FIGS. 1A and 1B, was made as to optical power for a range of drive currents. The plot for the enhanced laser (No. 141), such as shown in FIG. 1B, shown in the dotted line, shows a significant improvement over that of the standard laser (No. 251), such as shown in FIG. 1A, shown in solid line.

Figure 3:
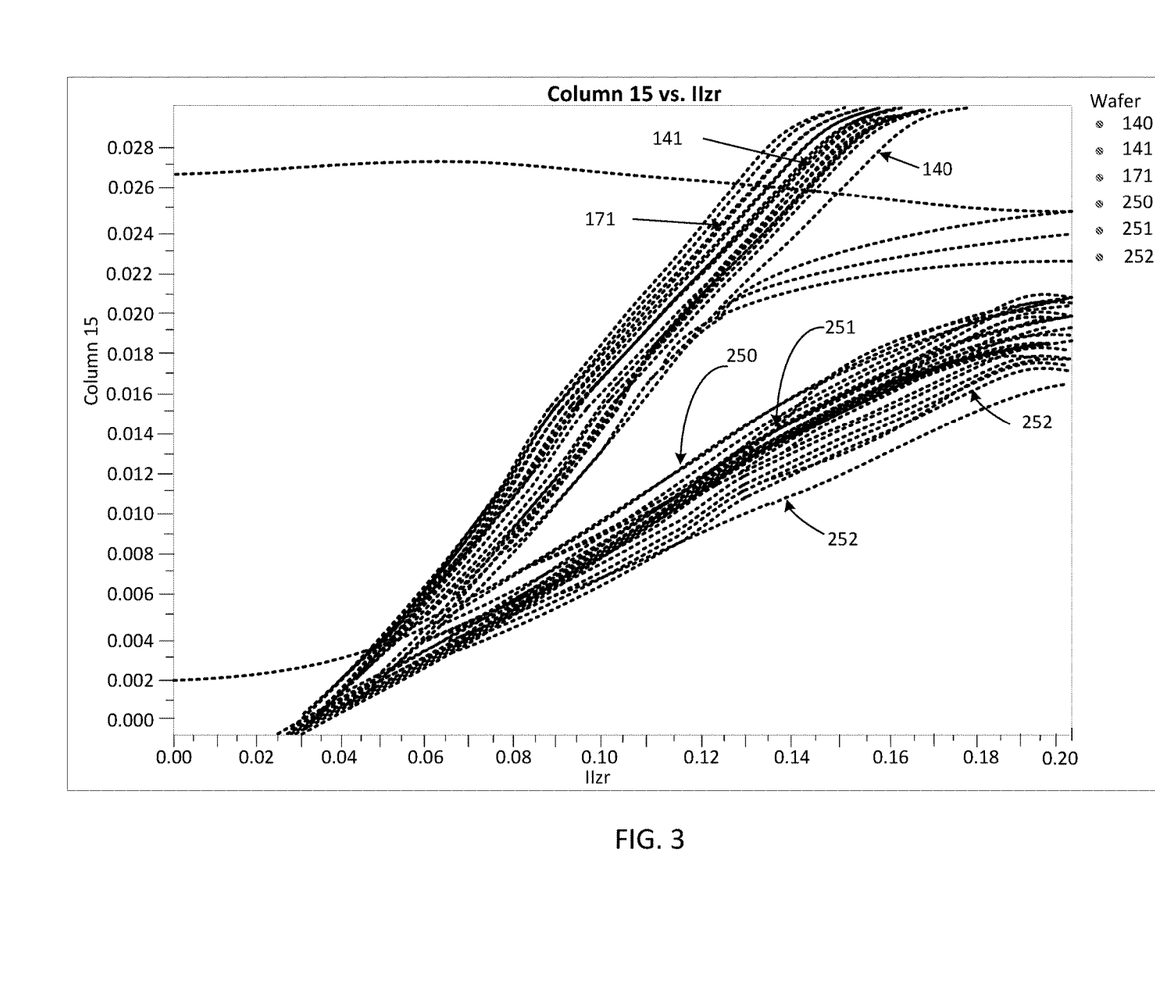
FIG. 3 depicts several plots of optical power as a function of drive current for a group of conventional MQW lasers and a group of MQW lasers as enhanced with a layer of tensile strain InAlAs in accordance with embodiments herein.

FIG. 3 includes plots similar to that shown in FIG. 2, for several individual lasers, some standard, some enhanced. The two lasers from FIG. 2 are also included, and their plots labelled accordingly. The group of enhanced lasers (e.g., 140, 141, 171) show a significant improvement in optical power over the group of standard lasers (e.g., 250, 251, 252).

Figure 4:
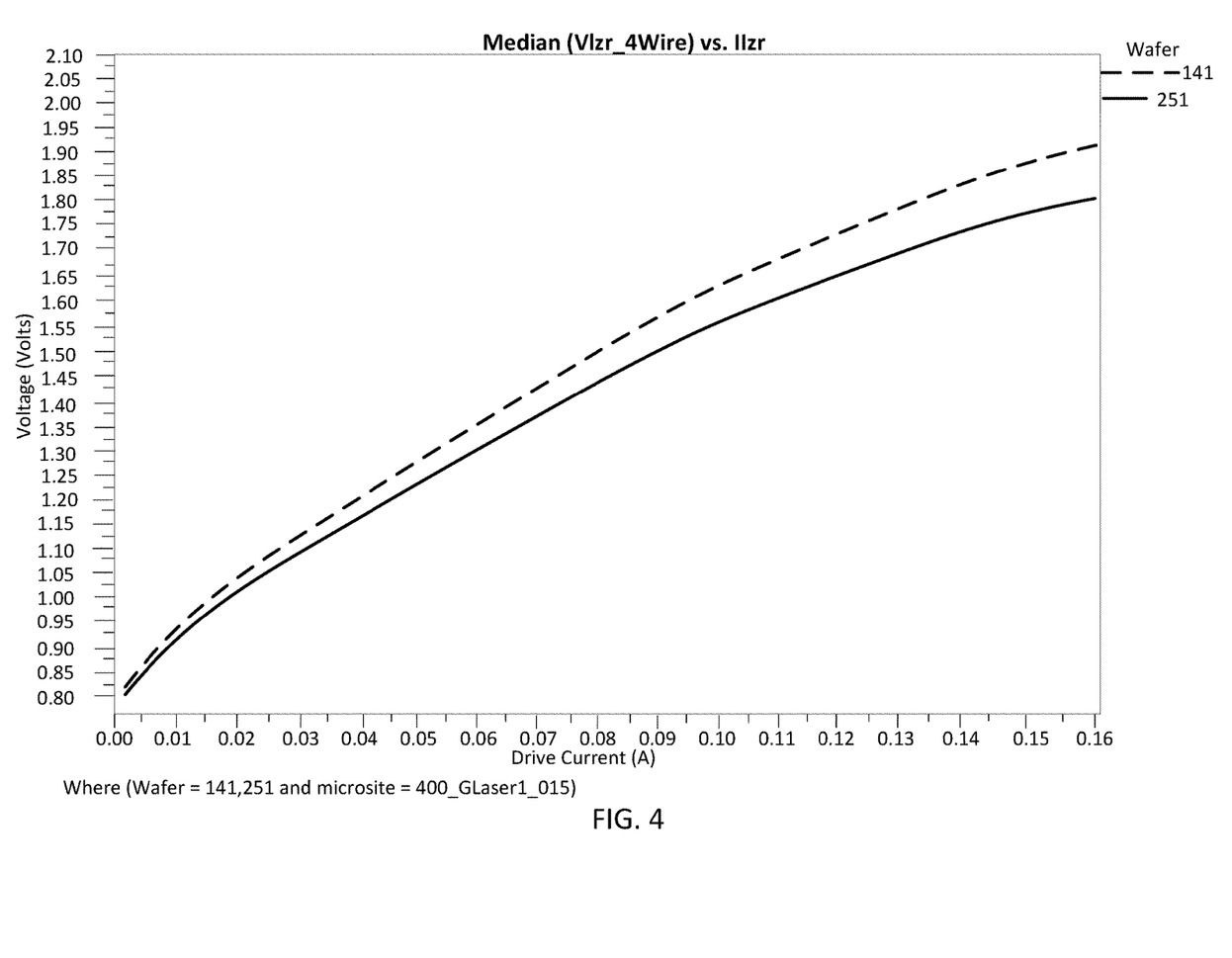
FIG. 4 depicts plots of diode characteristic voltage as a function of drive current for each of the two example MQW lasers that are shown in the optical power plots of FIG. 2.
Figure 5:
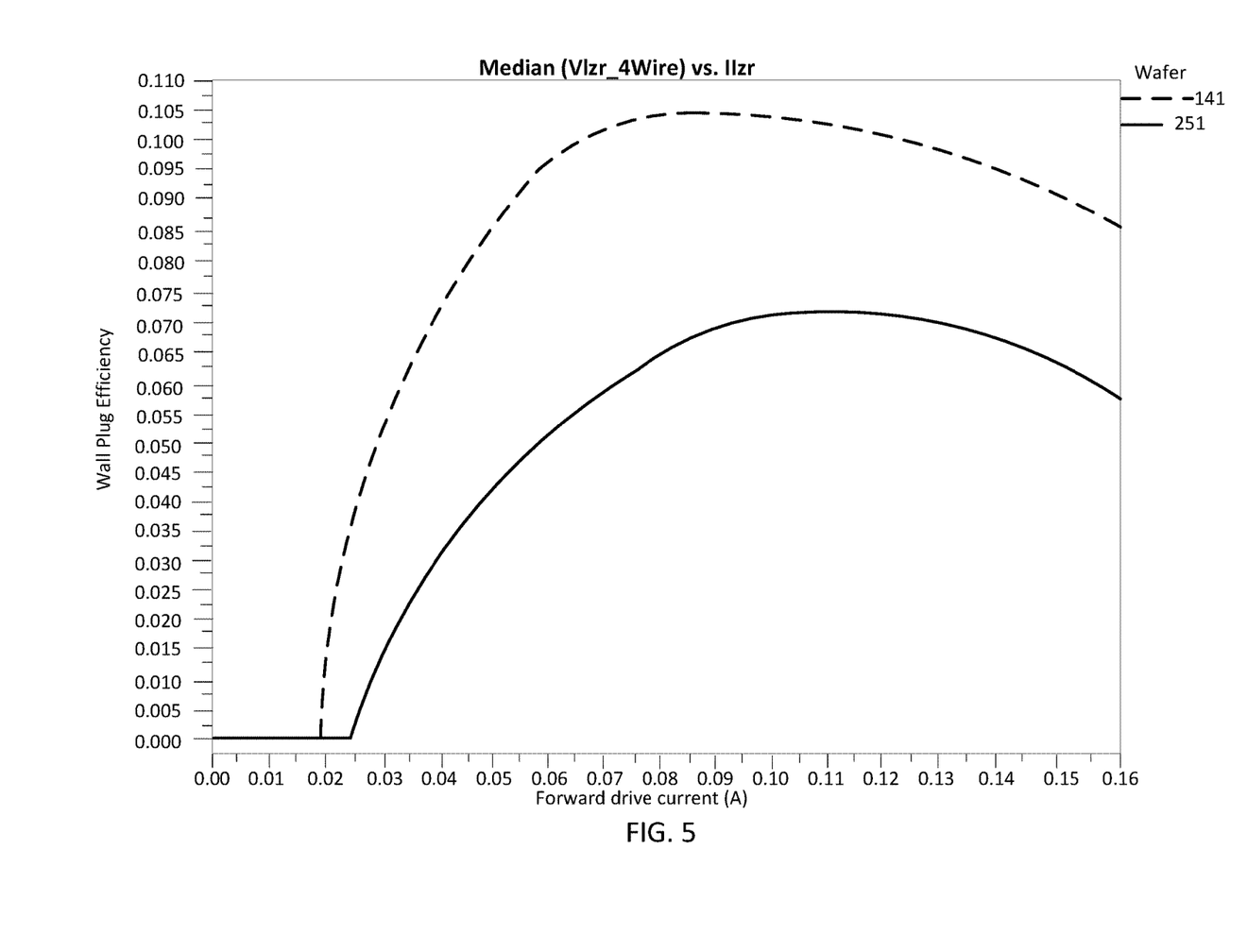
FIG. 5 depicts a plot of wall plug efficiency as a function of forward drive current for each of the two example MQW lasers that are shown in the optical power plots of FIG. 2.

FIGS. 4 and 5 are plots of diode characteristic voltage and peak wall plug efficiency, respectively, for the two example lasers Nos. 141 and 251 presented in FIGS. 2 and 3. As may readily be seen in FIG. 5, peak wall plug efficiency improved by 43%, with no significant change in diode characteristic current, as seen in FIG. 4.

These results confirm that n-carrier leakage is a major problem for efficient operation of a laser emitting around 1310 nm (or lower, such as at 1270 nm and down to 1050 nm) at temperatures higher than 80° C., and that the additional tensile strained proposed solution according to various embodiments provides a significant improvement to make more high temperature capable lasers in the emission range of 1050-1400 nm.

Thus, in embodiments, Tensile Strained InAlAs may be used as an electron blocker, inserted in the p-side separate confinement hetero structure (p-side SCH), to reduce the flow of n-carriers toward p-doped cladding in a laser emitting at between 1050 through 1400 nm, and made in the InGaAlAs/InP semiconductor system—or the InGaAsP/InP system.

In embodiments, this technique may be significantly useful in Si-Photonics hybrid lasers where high power at high temperature of operation are required. In embodiments, a proper positioning of the tensile strained layer is needed to provide the noted improvement in performances. It is noted that, in embodiments, the tensile strained layer may be positioned anywhere between the top or the bottom of the lattice matched InAlAs layer. Moreover, in embodiments, the lattice matched InAlAs layer may be left out completely, and only the additional electron containment layer provided at some position between an edge of the MQWs and the p-doped cladding. As noted above, in embodiments, the tensile strained layer 105 may be positioned anywhere on the p-side 103 of the MQWs, and there may be one or more neutral layers (not shown in FIG. 1), or a lattice matched layer 111, anywhere between the tensile strained layer 105 and the last MQW barrier layer, such as the top (or rightmost in FIG. 1) tensile strained InGaAlAs barrier 116, or between the tensile strained layer 105 and p-doped InP cladding layer 119.

In some embodiments, a 0.5% tensile strained layer may use a InAlAs composition of ($In_{0.45}Al_{0.35}As$), which may differ from a lattice matched InAlAs composition of ($In_{0.52}Al_{0.48}As$). Other compositions for each may be used, and in some embodiments, the same composition may be used for each of the tensile strained layer and the lattice matched layer.

In embodiments, the improved electron confinement of a tensile strained layer may be used to improve the efficiency of Si-Photonics planar hybrid lasers, as may be used in various optical transmission products. It is also noted that the disclosed technique may be of particular importance for Coarse Dense Wavelength Multiplexing (CWDM) that requires the use of semiconductor lasers operating efficiently at high temperatures, in excess of 80° C., while emitting at wavelength below 1310 nm (typically 1270 nm). As is known, the conduction band energy discontinuity between the MQWs and the InAlAs electron barriers shrinks when moving toward shorter wavelengths, resulting in insufficient n-carrier confinement and fast degradation of performances due to carrier leakage. Use of Tensile strained InAlAs provides a simple and effective solution to this problem and thereby facilitates the improvement of CWDM products that may be the preferred solution for over 100 Gbit/s Datacom transceivers used in data centers (inasmuch as they are compatible with single mode fiber).

EXAMPLES

Example 1 may include a Multiple Quantum Well (MQW) laser for operating at high temperatures, comprising: at least one quantum well made of compressively strained InGaAlAs layers that are alternatively stacked with tensile strained InGaAlAs layers, the at least one quantum well surrounded on one side by a n-doped cladding of InP and on the other side by a p-doped cladding of InP so as to form a double hetero-junction; a confinement layer of lattice-matched InAlAs provided between the at least two quantum wells and the p-doped InP cladding, the confinement layer having a first surface facing or adjacent to the quantum wells and a second surface facing or adjacent to the p-doped InP cladding; and an additional electron containment layer of tensile strained InAlAs, having a thickness smaller than that of the confinement layer, and provided either facing or adjacent to a surface of the confinement layer or between the two surfaces of the confinement layer.

Example 2 may include the MQW laser of example 1, and/or any other example herein, wherein the at least one quantum well is three or more quantum wells.

Example 3 may include the MQW laser of example 1, and/or any other example herein, wherein the layers of the least one quantum well are not doped.

Example 4 may include the MQW laser of example 1, and/or any other example herein, wherein the confinement layer is p-doped.

Example 5 may include the MQW laser of any one of examples 1-4, and/or any other example herein, wherein the additional electron containment layer is provided between the confinement layer and the p-doped InP cladding.

Example 6 may include the MQW laser of example 5, and/or any other example herein, wherein the laser emits light at a wavelength between 1050 nm and 1400 nm.

Example 7 may include the MQW laser of example 5, and/or any other example herein, wherein the laser emits light at a wavelength of one of 1310 nm or 1270 nm.

Example 8 may include the MQW laser of example 5, and/or any other example herein, wherein the additional electron containment layer has a thickness sufficiently large to avoid n-carriers from tunneling through it.

Example 9 may include the MQW laser of example 5, and/or any other example herein, wherein the additional electron containment layer, for a given amount of strain, has a thickness less than the critical thickness tc, as provided by the Matthews-Blakeslee limit.

Example 10 may include the MQW laser of example 5, and/or any other example herein, wherein the additional electron containment layer has a tensile strain of −0.5% strain.

Example 11 may include the MQW laser of example 5, and/or any other example herein, wherein the additional electron containment layer has a thickness between 80 and 200 Angstroms.

Example 12 may include the MQW laser of example 11, and/or any other example herein, wherein the additional electron containment layer has a tensile strain of between −0.1% and −1%.

Example 13 may include the MQW laser of example 5, and/or any other example herein, wherein the additional electron containment layer is p-doped.

Example 14 may include the MQW laser of example 5, and/or any other example herein, wherein the at least one quantum well is made of compressively strained InGaAsP layers that are alternatively stacked with tensile strained InGaAsP layers, instead of compressively strained InGaAlAs layers that are alternatively stacked with tensile strained InGaAlAs layers.

Example 15 may include the MQW laser of example 5, and/or any other example herein, wherein the additional electron containment layer has a first surface and a second surface, and is positioned somewhere between the first surface and the second surface of the confinement layer.

Example 16 may a multiple quantum well (MQW) laser for operating at high temperatures, comprising at least one quantum well made of either: compressively strained InGaAsP layers that are alternatively stacked with tensile strained InGaAsP layers, or compressively strained InGaAlAs layers that are alternatively stacked with tensile strained InGaAlAs layers, the at least one quantum well surrounded on one side by a n-doped cladding of InP and on the other side by a p-doped cladding of InP so as to form a double hetero-junction; and an additional electron containment layer of tensile strained InAlAs provided between the at least one quantum well and the p-doped InP cladding, the additional electron containment layer having a first surface facing or adjacent to an outer edge surface of the at least one quantum well and a second surface, opposite the first surface, facing or adjacent to the p-doped InP cladding.

Example 17 may include the MQW laser of example 16, and/or any other example herein, wherein the laser emits light at a wavelength between 1050 nm and 1400 nm.

Example 18 may include the MQW laser of example 16, and/or any other example herein, wherein the additional electron containment layer has a thickness sufficiently large to avoid n-carriers from tunneling through it.

Example 19 may include the MQW laser of example 16, and/or any other example herein, wherein the additional electron containment layer, for a given amount of strain, has a thickness less than the critical thickness tc, as provided by the Matthews-Blakeslee limit.

Example 20 may include the MQW laser of any one of examples 16-19, and/or any other example herein, further comprising a confinement layer of lattice-matched InAlAs provided between the at least one quantum well and the p-doped InP cladding, the confinement layer having either: a first surface facing or adjacent to the at least one quantum well and a second surface facing or adjacent to the additional electron containment layer, or a first surface facing or adjacent to the additional electron containment layer and a second surface facing or adjacent to the p-doped InP cladding.

Example 21 may include the MQW laser of example 20, and/or any other example herein, wherein the additional electron containment layer is p-doped.

Example 22 may include the MQW laser of example 20, and/or any other example herein, wherein the additional electron containment layer has a tensile strain of between −0.1% and −1%.

Example 23 may include the MQW laser of example 20, and/or any other example herein, wherein the additional electron containment layer has a thickness between 80 and 1500 Angstroms.

Example 24 may include an additional electron containment layer for a multiple quantum well (MQW) laser for operating at high temperatures, the additional electron containment layer to control carrier leakage from the MQWs, the additional electron containment layer comprising: a first surface; a second surface opposite the first surface; a thickness between the first and second surfaces; and a semiconductor lattice comprising tensile strained InGaAlAs.

Example 25 may include the additional electron containment layer of example 24, and/or any other example herein, provided in a MQW laser device, wherein the first surface is provided facing or adjacent to a confinement layer of lattice-matched InAlAs and the second surface is provided facing or adjacent to p-doped InP cladding.

Example 26 may include the additional electron containment layer of example 24, and/or any other example herein, provided in a MQW laser device, wherein the first surface is provided facing or adjacent to an end surface of a MQW region and the second surface is provided facing or adjacent to a confinement layer of lattice-matched InAlAs.

Example 27 may include the additional electron containment layer of any one of examples 24-26 and/or any other example herein, wherein the confinement layer of lattice-matched InAlAs is provided facing or adjacent to a p-doped InP cladding.

Example 28 may include the additional electron containment layer of example 27, and/or any other example herein, wherein the semiconductor lattice is under between −0.1% and −1% strain.

Example 29 may include the additional electron containment layer of example 27, and/or any other example herein, wherein the semiconductor lattice is under between −0.5% and −0.6% strain.

Example 30 may include the additional electron containment layer of example 27, and/or any other example herein, wherein the semiconductor lattice has a thickness of between 80 and 1500 Angstroms.

Example 31 may include the additional electron containment layer of example 27, and/or any other example herein, wherein for a given amount of strain, has a thickness less than the critical thickness tc, as provided by the Matthews-Blakeslee limit.

Example 32 may include the additional electron containment layer of example 24, and/or any other example herein, provided in a MQW laser device including a confinement layer of lattice-matched InAlAs, the confinement layer having a first surface and a second surface, opposite to the first, wherein the additional electron containment layer is positioned somewhere between the first surface and the second surface of the confinement layer.

Example 33 may include the additional electron containment layer of example 27, and/or any other example herein, wherein the additional electron containment layer is p-doped.

Example 34 may include the additional electron containment layer of example 24, and/or any other example herein, provided in a MQW laser device between a confinement layer of lattice-matched InAlAs and a p-doped InP cladding.

Example 35 may include the additional electron containment layer of example 24, and/or any other example herein, provided in a MQW laser device between an end surface of a MQW region and a confinement layer of lattice-matched InAlAs.

Example 36 may include the additional electron containment layer of example 24, and/or any other example herein, provided in a MQW laser device between an end surface of a MQW region and a p-doped InP cladding.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

I claim:

1. A multiple quantum well (MQW) laser for operating at high temperatures, comprising:

at least one quantum well made of compressively strained Indium-Gallium-Aluminum-Arsenide (InGaAlAs) layers that are alternatively stacked with tensile strained InGaAlAs layers;

the at least one quantum well surrounded on one side by a n-doped cladding of Indium-Phosphide (InP) and on another side by a p-doped cladding of InP so as to form a double hetero-junction;

a confinement layer of lattice-matched Indium Aluminum Arsenide (InAlAs)

provided between the at least one quantum well and the p-doped InP cladding, the confinement layer having a first surface facing or adjacent to the quantum wells and a second surface facing or adjacent to the p-doped InP cladding;

an additional electron containment layer of tensile strained InAlAs, having a thickness smaller than that of the confinement layer, and provided either facing or adjacent to a surface of the confinement layer or between the two surfaces of the confinement layer.

2. The MQW laser of claim 1, wherein there are three or more quantum wells.

3. The MQW laser of claim 2, wherein the confinement layer is p-doped.

4. The MQW laser of claim 1, wherein the layers of the least one quantum well are not doped.

5. The MQW laser of claim 1, wherein the additional electron containment layer is provided between the confinement layer and the p-doped InP cladding.

6. The MQW laser of claim 5, wherein the additional electron containment layer is p-doped.

7. The MQW laser of claim 1, wherein the laser emits light at a wavelength between 1050 nanometers (nm) and 1400 nm.

8. The MQW laser of claim 1, wherein the laser emits light at a wavelength of one of 1310 nm or 1270 nm.

9. The MQW laser of claim 1, wherein the additional electron containment layer has a thickness sufficiently large to avoid n-carriers from tunneling through it.

10. The MQW laser of claim 1, wherein the additional electron containment layer, for a given amount of strain, has a thickness less than a critical thickness tc, as provided by the Matthews-Blakeslee limit.

11. The MQW laser of claim 1, wherein the additional electron containment layer has a tensile strain of −0.5% strain.

12. The MQW laser of claim 11, wherein the additional electron containment layer has a thickness between 80 and 200 Angstroms.

13. The MQW laser of claim 1, wherein the additional electron containment layer has a tensile strain of between −0.1% and −1%.

14. The MQW laser of claim 1, wherein the at least one quantum well is made of compressively strained Indium Gallium Arsenic Phosphide (InGaAsP) layers that are alternatively stacked with tensile strained InGaAsP layers, instead of compressively strained InGaAlAs layers that are alternatively stacked with tensile strained InGaAlAs layers.

15. The MQW laser of claim 1, wherein the additional electron containment layer has a first surface and a second surface, and is positioned somewhere between the first surface and the second surface of the confinement layer.

16. A MQW laser for operating at high temperatures, comprising:

at least one quantum well made of either: compressively strained InGaAsP layers that are alternatively stacked with tensile strained InGaAsP layers, or compressively strained InGaAlAs layers that are alternatively stacked with tensile strained InGaAlAs layers, the at least one quantum well surrounded on one side by an n-doped cladding of InP and on another side by a p-doped cladding of InP so as to form a double heterojunction;

a confinement layer of lattice-matched InAlAs provided between the at least one quantum well and the p-doped InP cladding, the confinement layer having either:
- a first surface facing or adjacent to the at least one quantum well and a second surface facing or adjacent to an additional electron containment layer, or
- a first surface facing or adjacent to the additional electron containment layer and a second surface facing or adjacent to the p-doped InP cladding; and the additional electron containment layer of tensile strained InAlAs provided somewhere between the at least one quantum well and the p-doped InP cladding, the additional electron containment layer having a first surface facing or adjacent to an outer edge surface of the at least one quantum well and a second surface, opposite the first surface, facing or adjacent to the p-doped InP cladding.

17. The MQW laser of claim 16, wherein the laser emits light at a wavelength between 1050 nm and 1400 nm.

18. The MQW laser of claim 16, wherein the additional electron containment layer has a thickness sufficiently large to avoid n-carriers from tunneling through it.

19. The MQW laser of claim 16, wherein the additional electron containment layer, for a given amount of strain, has a thickness less than a critical thickness $t_c$, as provided by the Matthews-Blakeslee limit.

20. The MQW laser of claim 16, wherein the additional electron containment layer is p-doped, and has a tensile strain of between −0.1% and −1%.

21. The MQW laser of claim 16, wherein the additional electron containment layer has a thickness between 80 and 1500 Angstroms.

22. An additional electron containment layer for a multiple quantum well (MQW) laser for operating at high temperatures, the additional electron containment layer to control carrier leakage from the MQW, the additional electron containment layer comprising:
- a first surface;
- a second surface opposite the first surface;
- a thickness between the first and second surfaces; and
- a semiconductor lattice comprising tensile strained InGaAlAs, wherein the additional electron containment layer is provided in a device, and either:
- the first surface is provided facing a confinement layer of lattice-matched InAlAs and the second surface is provided facing a p-doped InP cladding, or
- the first surface is provided facing an end surface of a MQW region and the second surface is provided facing the confinement layer of lattice-matched InAlAs.

23. The additional electron containment layer of claim 22, wherein the MQW laser emits light at a wavelength between 1050 nm and 1400 nm.

24. The additional electron containment layer of claim 22, wherein the additional electron containment layer is p-doped, and has a tensile strain of between −0.1% and −1%.

* * * * *